(12) United States Patent
Furihata

(10) Patent No.: US 6,506,978 B1
(45) Date of Patent: Jan. 14, 2003

(54) FLEXIBLE WIRING BOARD, ELECTROOPTICAL DEVICE AND ELECTRONIC EQUIPMENT

(75) Inventor: Hiroaki Furihata, Shiga-mura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/654,119

(22) Filed: Sep. 1, 2000

(30) Foreign Application Priority Data

Sep. 3, 1999 (JP) ............................................ 11-249463

(51) Int. Cl.[7] ................................................ H05K 1/00
(52) U.S. Cl. ........................ 174/254; 174/262; 174/259; 361/749
(58) Field of Search ................................ 174/261, 262, 174/254, 259; 361/749, 750, 751

(56) References Cited

U.S. PATENT DOCUMENTS

| | | | | |
|---|---|---|---|---|
| 4,659,872 A | * | 4/1987 | Dery et al. ............... | 174/117 A |
| 4,740,657 A | * | 4/1988 | Tsukagoshi et al. .......... | 174/88 |
| 5,065,505 A | * | 11/1991 | Matsubara et al. ........... | 29/830 |
| 5,575,662 A | * | 11/1996 | Yamamoto et al. ........... | 439/67 |
| 5,661,042 A | * | 8/1997 | Fang et al. .................... | 438/17 |
| 5,679,928 A | * | 10/1997 | Okano et al. ............... | 174/261 |
| 5,893,623 A | * | 4/1999 | Muramatsu .................. | 349/152 |
| 6,031,590 A | * | 2/2000 | Kim ............................ | 349/86 |
| 6,061,246 A | * | 5/2000 | Oh et al. ..................... | 361/749 |
| 6,063,647 A | * | 5/2000 | Chen et al. .................. | 438/108 |
| 6,118,665 A | * | 9/2000 | Kishida et al. .............. | 361/749 |
| 6,239,496 B1 | * | 5/2001 | Asada ........................ | 257/777 |

FOREIGN PATENT DOCUMENTS

| | | |
|---|---|---|
| JP | 06037451 | 2/1994 |
| JP | 06-289371 | 10/1994 |

* cited by examiner

Primary Examiner—Albert W. Paladini
Assistant Examiner—JoséH. Alcala
(74) Attorney, Agent, or Firm—Harness, Dickey & Pierce, P.L.C.

(57) ABSTRACT

A flexible wiring board 100 includes a first single-sided flexible board 10 and a second single-sided flexible board 20. The first single-sided flexible board 10 includes a first base body 12 having an insulative property, and a first wiring layer 14 formed in a predetermined pattern on the first base body. The second single-sided flexible board 20 includes a second base body 22 having an insulative property, and a second wiring layer 24 formed in a predetermined pattern on the second base body. The first and second single-sided flexible boards respectively have insulating layers 16 and 26 covering the wiring layers 14 and 24, and the insulating layers are provided with contact sections C10 and C20. The first single-sided flexible board 10 and the second single-sided flexible board 20 are arranged so that the first wiring layer and the second wiring layer face each other, and are bonded through an anisotropically conductive adhesive layer 30.

26 Claims, 10 Drawing Sheets

TV REPRODUCTION CIRCUIT (A)

(B)

(C)

FLEXIBLE WIRING BOARD, ELECTROOPTICAL DEVICE AND ELECTRONIC EQUIPMENT

BACKGROUND OF THE INVENTION

1. Field of the Invention

The present invention relates to an electrooptical device, such as a liquid-crystal display device or an EL (electroluminescence) display device, and a flexible wiring board appropriate for use in these electrooptical devices. The present invention also relates to electronic equipment incorporating the electrooptical device.

2. Description of the Related Art

As the demand for more compact and thinner design is currently mounting in electronic equipment, high-density wiring and thin design is required of a flexible printed circuit (FPC) board used in the electronic equipment.

A variety of manufacturing methods for the flexible printed circuit board are known. Known as a manufacturing method for the flexible printed circuit board based on a double-sided copper-foil laminated flexible board is a subtractive method, for instance. The manufacturing method for the flexible printed circuit board based on the subtractive method is now discussed.

(1) First, a hole, i.e., a through-hole is drilled in the double-sided copper-foil laminated flexible circuit board using a drill. (2) In succession, the surface of the copper foil and the hole are plated through electroless plating. (3) After a photoresist or a resist ink is applied over the plated surface, a resist layer is produced through patterning to leave an unnecessary portion as a circuit. (4) In succession, an exposed area expected to become a circuit is thickened with a conductor such as copper or the like through electroplating. (5) After the conductor is plated with gold or solder, the resist layer is peeled off. In this state, the area where the conductor is formed, and the through-hole are covered with gold or solder. (6) Etching is then performed by using an etchant which dissolves neither gold nor solder but copper only, and the circuit is thus produced. (7) An overcoat ink or a cover film is formed, as required.

The following problems arise when the flexible printed circuit board is fabricated from the double-sided copperfoil laminated flexible circuit board.

In the manufacturing method, through-holes need to be created to electrically connect circuits formed on the double sides of the double-sided copper-foil laminated flexible circuit board. Since the through-holes are drilled by a drill through a mechanical drilling step, the efficiency of manufacturing process is low. Since electrical connection is performed using a plating technique subsequent to the drilling operation, a number of manufacturing steps, such as the cleaning of the inner wall of the hole, the pre-process of the electroless plating, electroless plating, and electroplating for thickening the conductor, are needed involving a great deal of time, productivity is lowered, and a costly wiring board thus results.

Since the mechanical drilling step using the drill sets a limit to the effort to promote the miniaturization of a contact section in size, a high-density wiring pattern is not accomplished.

It is an object of the present invention to provide a flexible wiring board which is of high productivity and low cost, while permitting a wiring pattern to be miniaturized. It is another object of the present invention to provide an electrooptical device and electronic equipment, each incorporating the flexible wiring board.

SUMMARY OF THE INVENTION

A flexible wiring board of the present invention includes a first single-sided flexible board and a second single-sided flexible board, wherein the first single-sided flexible board comprises a first base body having an insulative property, and a first wiring layer formed in a predetermined pattern on the first base body, the second single-sided flexible board comprises a second base body having an insulative property, and a second wiring layer formed in a predetermined pattern on the second base body, an insulating layer for covering the wiring layer is formed on at least one of the first and second single-sided flexible boards, a hole, forming a contact section, is created in the insulating layer to electrically connect the first wiring layer and the second wiring layer within a predetermined area, and the first single-sided flexible board and the second single-sided flexible board are arranged with the first wiring layer and the second wiring layer in a facing state, and are bonded through an anisotropically conductive adhesive layer.

In this flexible wiring board, the contact section for electrically connecting the two wiring layers includes the hole formed in the insulating layer. Unlike the double-sided copper-foil laminated flexible board, this arrangement eliminates the need for the formation of the through-hole, and allows the hole to be formed through a photolithographic technique. In the flexible wiring board of the present invention, a fine miniature contact section is formed, achieving a miniaturization of the wiring pattern. Compared to the through-hole with the inside thereof plated to form a conductor layer, the flexible wiring board of the present invention needs neither large number of steps nor great deal of time, and productivity is increased, and low-cost design is thus implemented.

The second single-sided flexible board is preferably arranged on a portion of the first single-sided flexible board.

This arrangement provides the following operation and advantages.

(1) The second single-sided flexible board is arranged on only an area where it is needed from the wiring design point of view. This arrangement achieves a reduced cost of the entire board, compared to the double-sided board that requires a full-size flexible wiring board.

(2) Flexibility of the flexible wiring board is controlled in the manufacture of the second single-sided flexible board, in addition to the design of wiring thereof. Specifically, in addition to considering the design of wiring, the strength and flexibility (so-called stiffness) of the flexible wiring board are selectively controlled by setting the formation area of the second single-sided flexible board.

(3) With the second single-sided flexible board partly arranged, the area where no second single-sided flexible board is formed has the thickness of the first single-sided flexible board only. By setting the formation area of the second single-sided flexible board, the thickness of the flexible wiring board in a bent portion thereof is set to be equal to the thickness of the single-sided flexible board. Compared to a double-sided board, the flexible wiring board having such a construction reduces space required for the bent portion of the flexible wiring board, thereby contributing to a thin design of electrooptical devices.

The first single-sided flexible board and the second single-sided flexible board are implemented in the following modes.

(A) The first single-sided flexible board may have a shape matching the general configuration of the flexible wiring board. In such an embodiment, a general wiring of the flexible wiring board is fabricated in the first single-sided flexible board. For instance, an input terminal region and an output terminal region may be arranged in the first single-sided flexible board.

(B) A portion of the second single-sided flexible board may be bonded onto the first single-sided flexible board while the remaining portion thereof may remain unbonded to the first single-sided flexible board. In this embodiment, the wiring design of the second single-sided flexible board is diversified. For instance, the first single-sided flexible board may include an input terminal region and a first output terminal region, and the second single-sided flexible board may include a second output terminal region.

(C) The first single-sided flexible board and the second single-sided flexible board may respectively include the insulating layers. This embodiment assures electrical insulation between the first wiring layer and the second wiring layer. As long as electrical insulation is assured, arranging the insulating layer on one of the first and second single-sided flexible boards is acceptable.

The anisotropically conductive adhesive layer may be formed by thermocompression bonding the first single-sided flexible board and the second single-sided flexible board with an anisotropically conductive film interposed therebetween.

An electrooptical device of the present invention includes an electrooptical material layer between mutually opposing first and second substrates, wherein the first substrate comprises a first wiring bonding region which does not overlap the second substrate, the second substrate comprises a second wiring bonding region which does not overlap the first substrate, and at least one of the first wiring bonding region and the second wiring bonding region is connected to the flexible wiring board according to the present invention.

The electrooptical material layer may be a liquid-crystal layer.

Electronic equipment of the present invention may include the electrooptical device of the present invention.

The electrooptical device and the electronic equipment of the present invention include the flexible wiring board of this invention and implement low-cost and thin-structure design, taking advantages of the operation and advantage of the flexible wiring board.

BRIEF DESCRIPTION OF THE DRAWINGS

FIGS. 8(A), 8(B), and 8(C) are external views of several pieces of the electronic equipment that incorporate the liquid-crystal display device of the present invention, wherein FIG. 8(A) shows a portable telephone, FIG. 8(B) shows a wristwatch, and FIG. 8(C) shows portable information equipment.

DETAILED DESCRIPTION OF THE PREFERRED EMBODIMENTS

Figure 1:
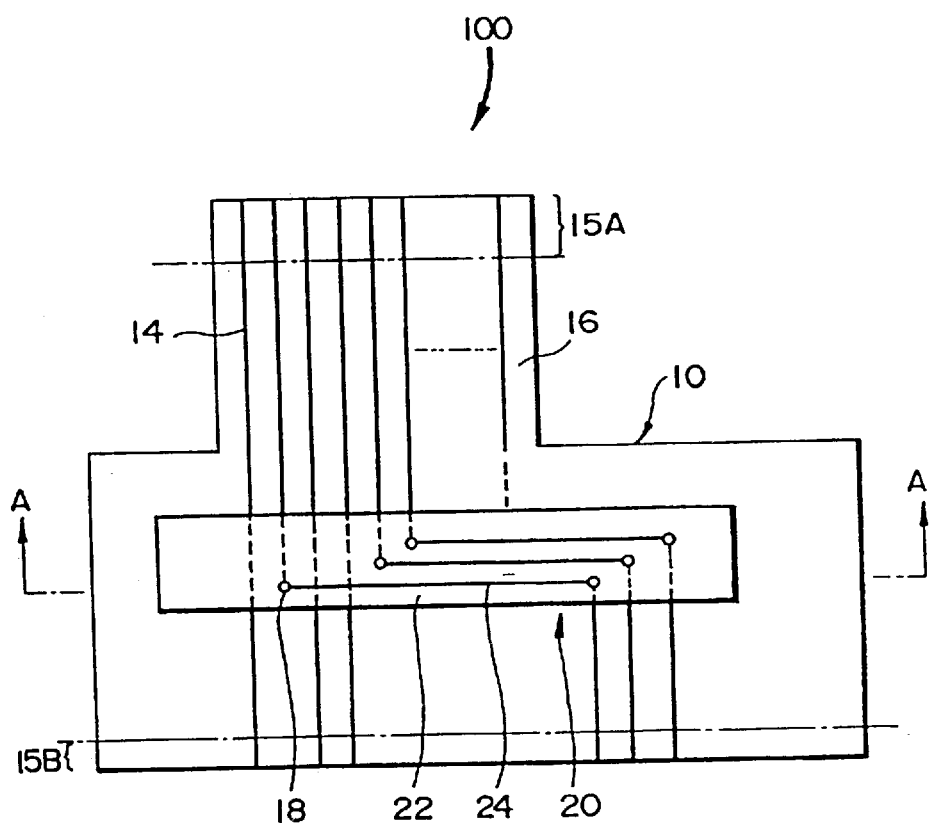
FIG. 1 is a plan view diagrammatically showing a flexible wiring board of the present invention.

A flexible wiring board, an electrooptical device, and electronic equipment of the present invention are now discussed, referring to the drawings.

Figure 2:
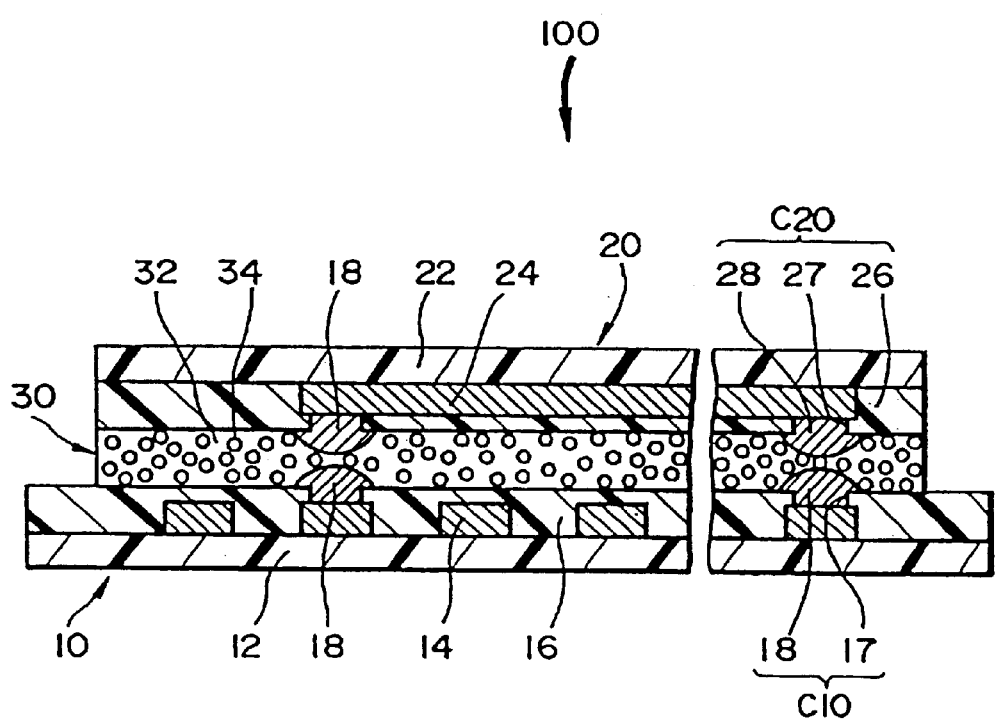
FIG. 2 is a cross-sectional view diagrammatically showing the flexible wiring board, taken along line A—A in FIG. 1.

FIG. 1 is a plan view diagrammatically showing one example of a flexible wiring board 100 of the present invention, and FIG. 2 is a cross-sectional view diagrammatically showing the flexible wiring board 100, taken along line A—A in FIG. 1.

The flexible wiring board 100 includes a first single-sided flexible board 10 and a second single-sided flexible board 20, and the first single-sided flexible board 10 and the second single-sided flexible board 20 are bonded together using an anisotropically conductive adhesive layer 30.

Referring to FIG. 1, the first single-sided flexible board 10 has a shape matching the general configuration of the flexible wiring board 100, and includes an input terminal region 15A and an output terminal region 15B having a width thereacross wider than the that of the input terminal region 15A. The second single-sided flexible board 20 overlaps a portion of the first single-sided flexible board 10.

Referring to FIG. 2, the cross-sectional construction of the flexible wiring board 100 is discussed. The first single-sided flexible board 10 includes a first base body 12 having an insulative property and flexibility, and a first wiring layer 14 formed in a predetermined pattern on the first base body 12. A first insulating layer 16 is formed on the first base body 12 to cover the first wiring layer 14. The hole 17 is formed in a predetermined area of the first insulating layer 16, producing a contact section C10. The hole 17 is produced by removing part of the first insulating layer 16 to partly expose the first wiring layer 14. A bump 18, constituting the contact section C10, is formed in the hole 17. The bump 18 is preferably projected out of the top surface of the first insulating layer 16 to assure reliable electrical connection.

The second single-sided flexible board 20 includes a second base body 22 having an insulative property and flexibility, and a second wiring layer 24 formed in a predetermined pattern on the second base body 22. A second insulating layer 26 is formed on the second base body 22 to cover the second wiring layer 24. A hole 27 is formed in a predetermined area of the second insulating layer 26, thereby producing a contact section C20. The hole 27 is produced by removing part of the second insulating layer 26 to partly expose the second wiring layer 24. A bump 28, constituting the contact section C20, is formed in the hole 27. The bump 28 is preferably projected out of the top surface of the second insulating layer 26.

The first single-sided flexible board 10 and the second single-sided flexible board 20 are arranged so that the wiring layers 14 and 24 thereof mutually face each other. The first single-sided flexible board 10 and the second single-sided flexible board 20 are bonded together using the anisotropically conductive adhesive layer 30. The anisotropically conductive adhesive layer 30 electrically connects the bump 18, forming the contact section C10 of the first single-sided flexible board 10, to the bump 28, forming the contact section C20 of the second single-sided flexible board 20.

The anisotropically conductive adhesive layer 30 is made of an anisotropically conductive film (ACF), and specifically, is manufactured by dispersing electrically conductive particles 34 in a high-molecular layer 32 of a resin or elastomer. The contact section C10 of the first single-sided flexible board 10 and the contact section C20 of the second single-sided flexible board 20 are electrically connected to each other through the electrically conductive particles 34 in the anisotropically conductive adhesive layer 30.

The operation and advantages of the flexible wiring board 100 are now discussed.

(1) In the flexible wiring board 100 of this embodiment, the contact sections C10 and C20 of the two wiring layers 14 and 24 are respectively fabricated of the holes 17 and 27 respectively formed in the insulating layers 16 and 26, and the bumps 18 and 28 respectively formed in the holes 17 and 27. This arrangement eliminates the need for the production of the through-holes, which would be required in a double-sided copper-foil laminated flexible board, and the holes 17 and 27 are created through a photolithographic process. A fine contact section is thus produced, thereby achieving the miniaturization of the wiring pattern.

(2) The second single-sided flexible board 20 may be arranged on an area only which is in need thereof from the wiring design point of view. Specifically, the two wiring layers 14 and 24 are partly formed on the flexible wiring board 100 of this embodiment. This arrangement achieves a reduced cost of the entire board, compared to the double-sided board which requires a full-size of flexible wiring board.

(3) Flexibility of the flexible wiring board 100 is controlled in the manufacture of the second single-sided flexible board 20, in addition to considering the design of wiring thereof. Specifically, in addition to considering the design of wiring, the strength and flexibility (so-called stiffness) of the flexible wiring board are selectively controlled by setting the formation area of the second single-sided flexible board 20.

(4) With the second single-sided flexible board 20 partly arranged, the area where no second single-sided flexible board 20 is formed has the thickness of the first single-sided flexible board 10 only. By setting the formation area of the second single-sided flexible board 20, the thickness of the flexible wiring board 100 in a bent portion thereof is set to be equal to the thickness of the single-sided flexible board 10. Compared to a double-sided board, the flexible wiring board having such a construction reduces space required for the bent portion of the flexible wiring board, thereby contributing to a thin design of electrooptical devices.

Figure 3:
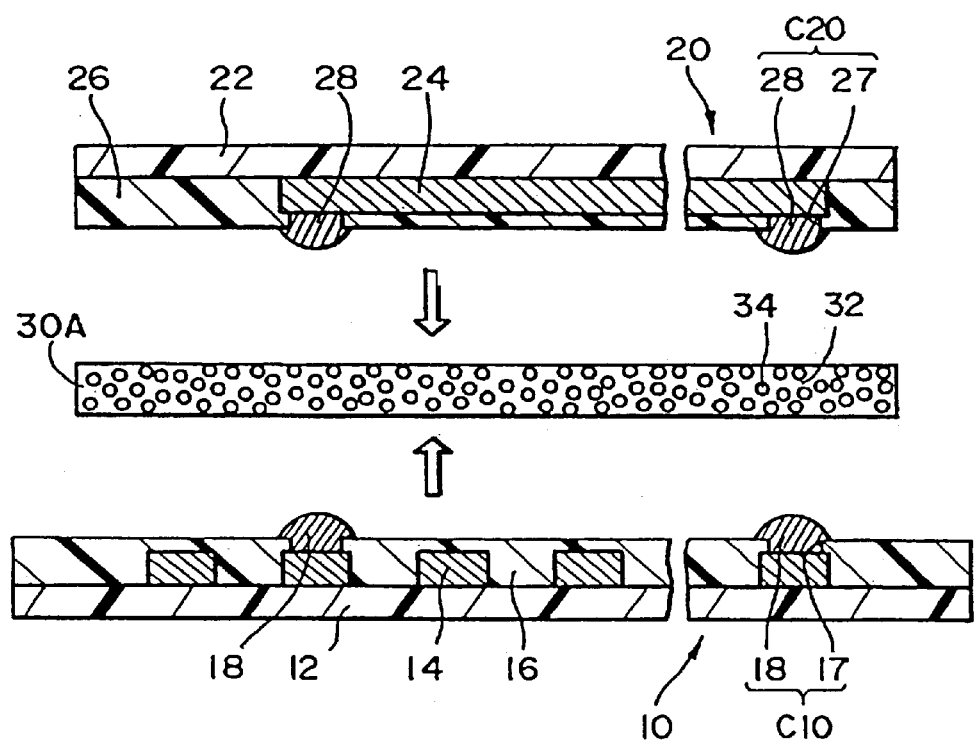
FIG. 3 is a cross-sectional view of a manufacturing method of the flexible wiring board of FIG. 1.

An example of manufacturing the flexible wiring board 100 is now discussed, referring to FIG. 3.

Produced first are the first single-sided flexible board 10 and the second single-sided flexible board 20, each having its own predetermined wiring pattern. The second single-sided flexible board 20 is placed onto the first single-sided flexible board 10 on a predetermined area with an anisotropically conductive film 30A interposed therebetween. The first single-sided flexible board 10 and the second single-sided flexible board 20 are then bonded together through thermocompression at a predetermined temperature (within a range of 200–230° C., for instance), thereby producing a flexible wiring board 100.

The manufacturing method of the single-sided flexible board is now discussed. The manufacturing method of the single-sided flexible board discussed below is one example only, and a known method other than this may be alternatively used. Although the manufacturing method of the first single-sided flexible board 10 is discussed here, the same manufacturing method may also apply to the production of the second single-sided flexible board 20 as well.

Figure 4:
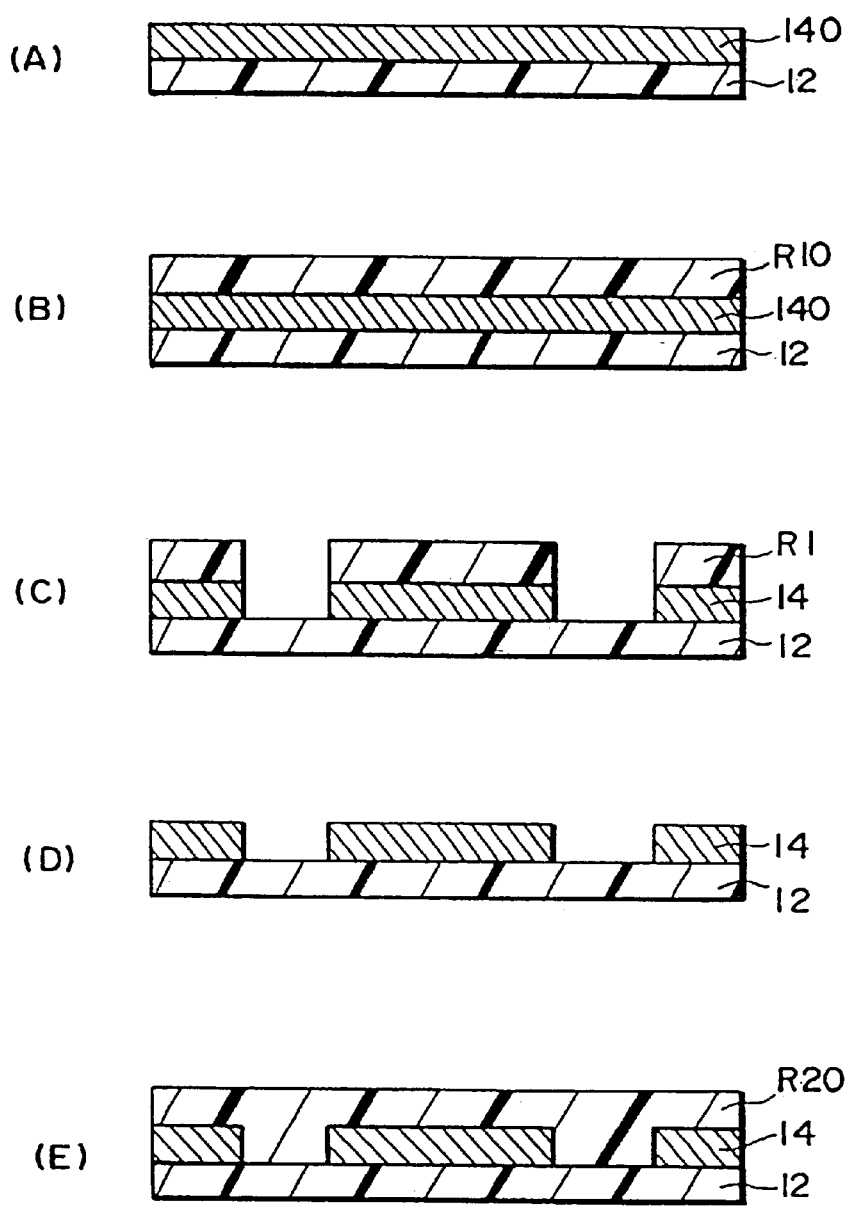
FIG. 4(A)–FIG. 4(E) are cross-sectional views diagrammatically showing manufacturing steps of the single-sided flexible board.

(1) Referring to FIG. 4(A), a conductive layer 140, constructed of copper, is formed on the first base body 12 of a resin, such as polyimide having flexibility. The conductive layer 140 is formed by gluing a film of copper onto the first base body 12. Next, referring to FIG. 4(B), a resist layer R10 of dry film type is laminated on the surface of the conductive layer 140. Referring to FIG. 4(C), the resist layer R10 is patterned through the photolithographic process, thereby becoming a resist layer R1 on a formation area of the wiring layer. The conductive layer 140 is etched using the resist layer R1 as a mask, thereby becoming the first wiring layer 14. Next, the resist layer R1 is peeled off as shown in FIG. 4(D).

Figure 5:
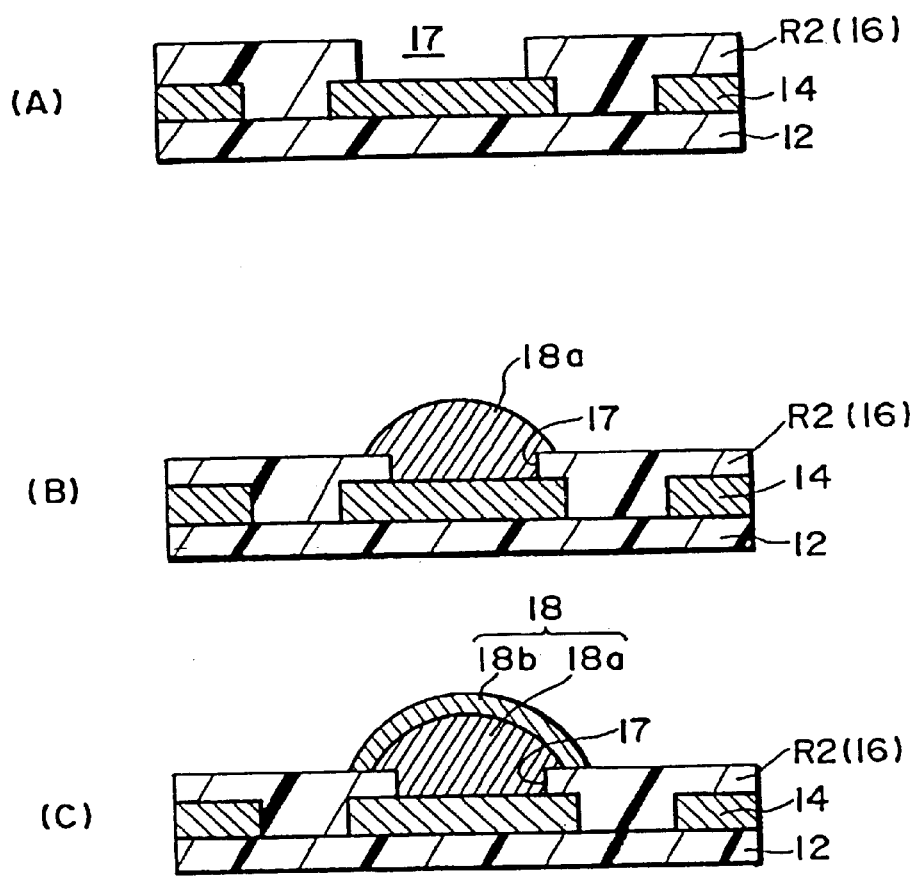
FIG. 5(A)–FIG. 5(C) are cross-sectional views diagrammatically showing manufacturing steps of the single-sided flexible board.

(2) Referring to FIG. 4(E), a resist is applied to fully cover the first wiring layer 14, forming a resist layer R20. Referring to FIG. 5(A), the resist layer R20 is patterned through the photolithographic process, thereby forming the hole 17 in the formation area of the contact section. The resist layer R2 then formed functions as the insulating layer 16 covering the first wiring layer 14.

(3) Referring to FIG. 5(B), a bump body 18a is produced in the hole 17 by depositing copper through electroplating. In succession, referring to FIG. 5(C), a metal, such as gold, is deposited on the surface of the bump body 18a through electroplating as required, thereby forming a bump surface layer 18b. In this way, the bump 18, fabricated of the bump body 18a and the bump surface layer 18b, is produced.

The flexible wiring board of this invention is not limited to any particular embodiments, and a variety of changes thereof is possible. For instance, only one of the first insulating layer 16 and the second insulating layer 26 may be employed as the insulating layer electrically isolating the first wiring layer 14 from the second wiring layer 24. It is sufficient enough if the bumps 18 and 28 respectively forming the contact sections C10 and C20 cause the contact section C10 and the contact section C20 to electrically connect to each other, and the bumps 18 and 28 are not limited to any particular form. The use of only one of the bumps 18 and 28 is also acceptable.

Figure 9:
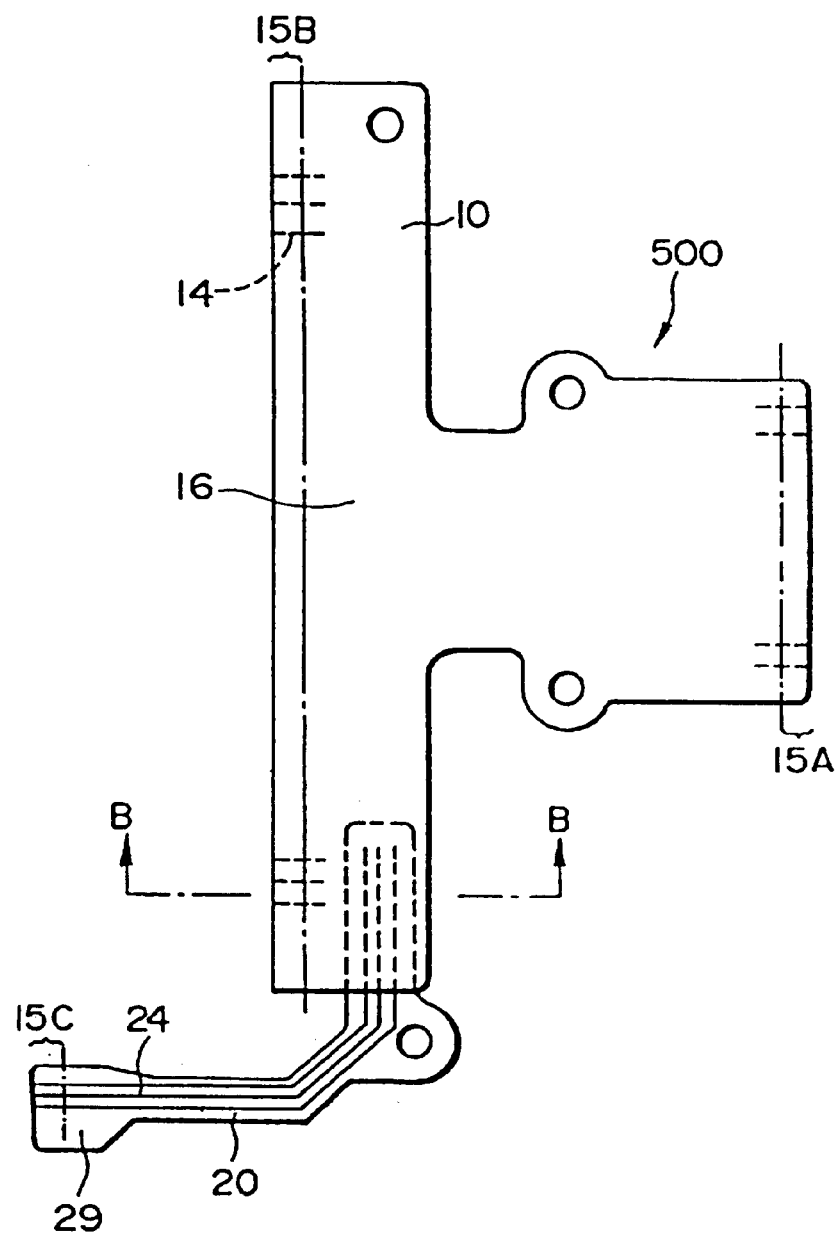
FIG. 9 is a plan view diagrammatically showing a modification of the flexible wiring board of the present invention.
Figure 10:
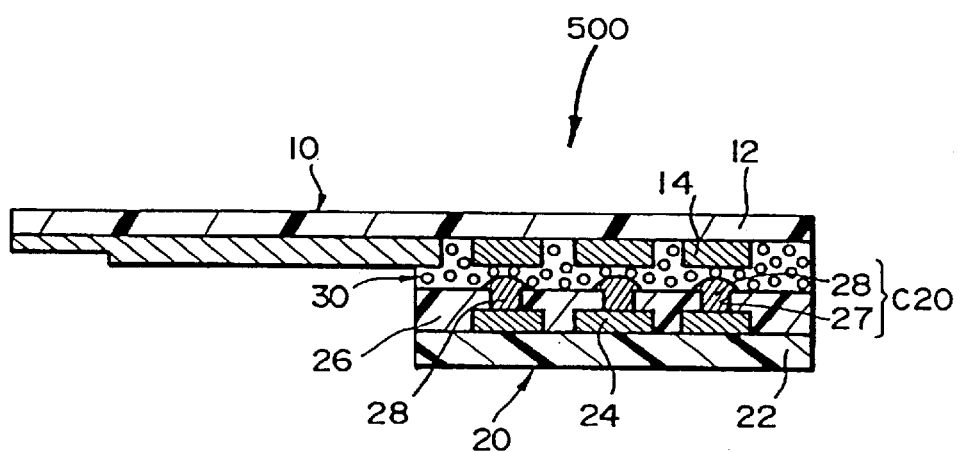
FIG. 10 is a cross-sectional view diagrammatically showing the flexible wiring board, taken along line B—B in FIG. 9.

FIG. 9 and FIG. 10 show a modification of the flexible wiring board. FIG. 9 is a plan view diagrammatically showing the flexible wiring board 500, and FIG. 10 is a cross-sectional view diagrammatically showing the flexible wiring board 500, taken along line B—B in FIG. 9. In this example, components having the same functions as of those of the components in the above-referenced flexible wiring board 100 are designated with substantially the same reference numerals, and the detailed discussion thereabout is omitted here.

A flexible wiring board 500 in this modification is different from the flexible wiring board 100 shown in FIG. 1 and FIG. 2 in that a portion of the second single-sided flexible board 20 is bonded to the first single-sided flexible board 10. The second single-sided flexible board 20 forms a branch wiring section, the free end of which is provided with a second output terminal region 15C. As shown in FIG. 10, the first single-sided flexible board 10 has no first insulating layer.

In this modification, the second single-sided flexible board 20 forming the branch wiring section has, on the end thereof, a grip portion 29 for handling. The grip portion 29 is formed to project in the direction opposite from the first single-sided flexible board 10. It is sufficient if the grip portion 29 is supported or clamped, mechanically or manually, in a bonding step for bonding the second output terminal region 15C to a joint portion, and the size and the shape of the grip portion 29 are not limited to any particular ones. Preferably, the grip portion 29 has no wiring therewithin to prevent mechanical damage on the wiring. With the grip portion 29 formed on the second single-sided flexible board 20, the second single-sided flexible board 20 is bonded to the predetermined area while being positioned easily with a good accuracy.

Besides the operation and advantages of the flexible wiring board 100, the flexible wiring board 500 can make connection at the two terminal regions of a unit to be connected (an electrooptical device to be discussed later, for example), thereby presenting a compact wiring structure. Specifically, when the flexible wiring board 500 is applied to an electrooptical device, the output terminal region 15B of the first single-sided flexible board 10 is used as a wiring for signals for the electrooptical device, while the output terminal region 15C of the second single-sided flexible board 20 is used for a wiring for scanning.

Figure 6:
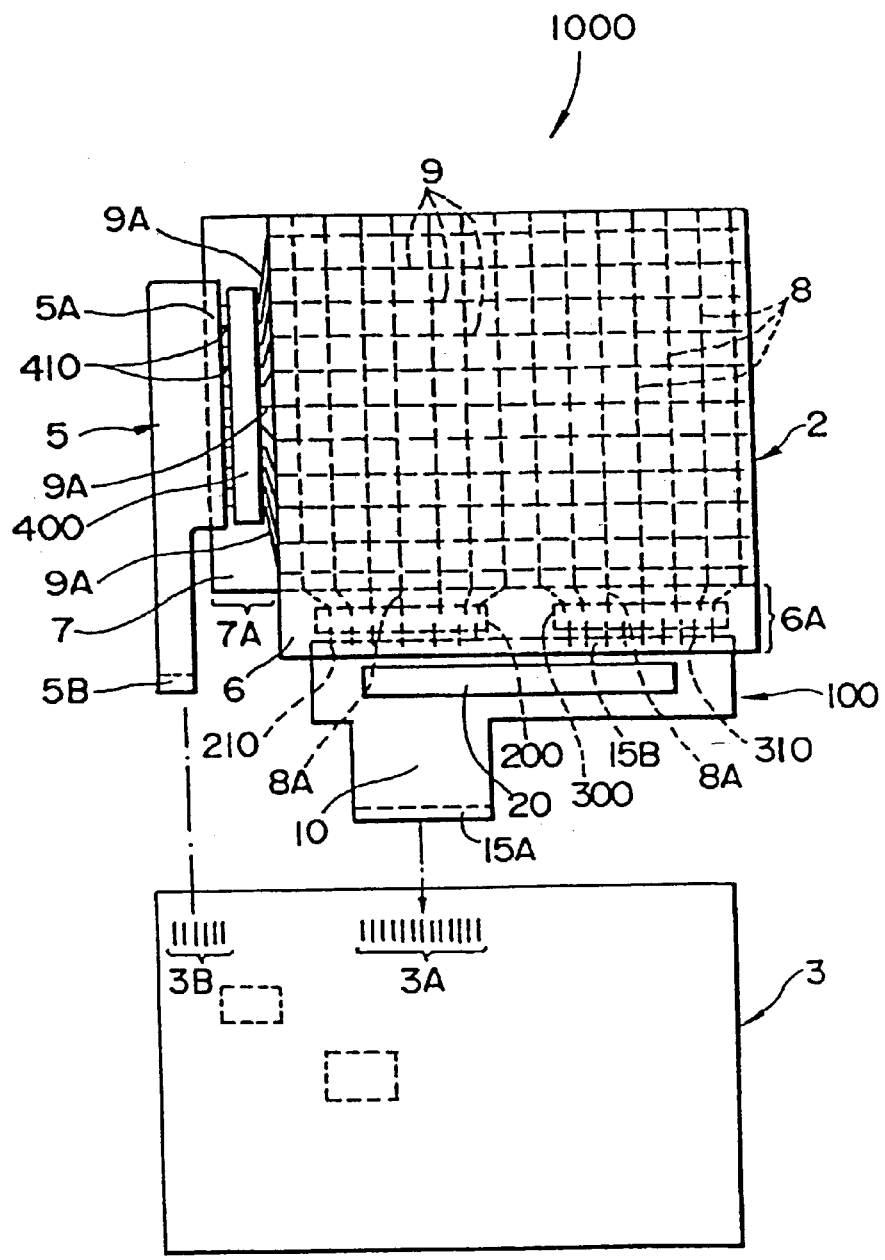
FIG. 6 is an exploded plan view diagrammatically showing a liquid-crystal display device which incorporates the flexible wiring board of the present invention.

An embodiment of the present invention is a liquid-crystal display device, as an example of an electrooptical device in which the flexible wiring board of the present invention is incorporated. FIG. 6 is a plan view diagrammatically showing a liquid-crystal display device 1000 of this embodiment.

The liquid-crystal display device 1000 is a passive-matrix, reflective-type liquid-crystal display device. The liquid-crystal display device 1000 includes a liquid-crystal display panel 2 and a printed board 3. The liquid-crystal display panel 2 and the printed board 3 are connected to each other through a first flexible wiring board 100 and a second flexible wiring board 5 of the present invention.

The liquid-crystal display panel 2 includes a pair of opposing glass substrates 6 and 7. An unshown sealing material is interposed between the glass substrates 6 and 7 in a manner such that the sealing material surrounds the display area of the substrates 6 and 7. The gap, defined by the glass substrates 6 and 7 and the sealing material, is encapsulated with a liquid crystal. A plurality of signal electrodes 8 extending in parallel are formed on the surface of the glass substrate 6, facing the glass substrate 7. A plurality of scanning electrodes 9, extending in a direction perpendicular to the signal electrodes 8, are formed on the surface of the glass substrate 7, facing the glass substrate 6.

In one predetermined edge portion (a lower edge portion in FIG. 6) of the liquid-crystal display panel 2, the edge of the glass substrate 6 is designed to project out of the edge of the glass substrate 7 laterally (downward in FIG. 6), and the projecting portion (the area where the glass substrate 6 does not overlap the glass substrate 7) forms a wiring joint section 6A. In another edge portion (on a left-side edge portion in FIG. 6), next to the above-referenced edge portion of the liquid-crystal display panel 2, the edge of the other glass substrate 7 projects out of the edge of the one glass substrate 6 laterally (leftward in FIG. 6), and a wiring joint section 7A is thus formed. IC signal drivers 200 and 300 are COG (Chip On Glass) mounted on the wiring joint section 6A of the glass substrate 6. These IC signal drivers 200 and 300 are connected to an output terminal section 8A to which the plurality of the signal electrodes 8 extend, and are also connected to input terminals 210 and 310 arranged on the edge portion of the wiring joint section 6A. An IC scanning driver 400 is COG-mounted on the wiring joint section 7A of the glass substrate 7. The IC scanning driver 400 is connected to the output terminal section 9A to which the plurality of the scanning electrodes 9 extend and is connected to input terminals 410 arranged on the edge portion of the wiring joint section 7A.

The output terminal region 15B of the first flexible wiring board 100 is bonded, using an anisotropically conductive film (ACF), to be electrically connected to the plurality of the input terminals 210 and 310 arranged along the long side of the wiring joint section 6A of the glass substrate 6. Similarly, the output terminal section 5A of the second flexible wiring board 5 is bonded, using an anisotropically conductive film, to be electrically connected to the plurality of input terminals 410 arranged along the long side of wiring joint section 7A of the glass substrate 7. The input terminal region 15A of the first flexible wiring board 100 is bonded to the output terminal region 3A formed in the printed board 3 using an anisotropically conductive film. The input terminal region 5B of the second flexible wiring board 5 is bonded to the output terminal region 3B formed in the printed board 3 using an anisotropically conductive film. A predetermined wiring is formed on the printed board 3 and a diversity of electronic components is mounted on the printed board 3 to control and drive the liquid-crystal display panel 2.

Some electronic equipment employing the liquid-crystal display device thus constructed may be provided with an input unit such as a keyboard or numerical keys, and presents data on a liquid-crystal display panel in response to an input operation to the input unit. In such electronic equipment, the liquid-crystal display panel and a printed board are assembled in a chassis (a panel housing frame) Two flexible wiring boards 100 and 5 are bent so that the printed board is arranged behind the liquid-crystal display panel.

The electrooptical device of the present invention includes the flexible wiring board of the present invention, and implements low-cost and thin-structure design, taking advantage of the operation and advantage of the above-referenced flexible wiring board.

Examples of electronic equipment incorporating a liquid-crystal display device as the electrooptical device of the present invention are now discussed.

(1) Digital Still Camera

Figure 7:
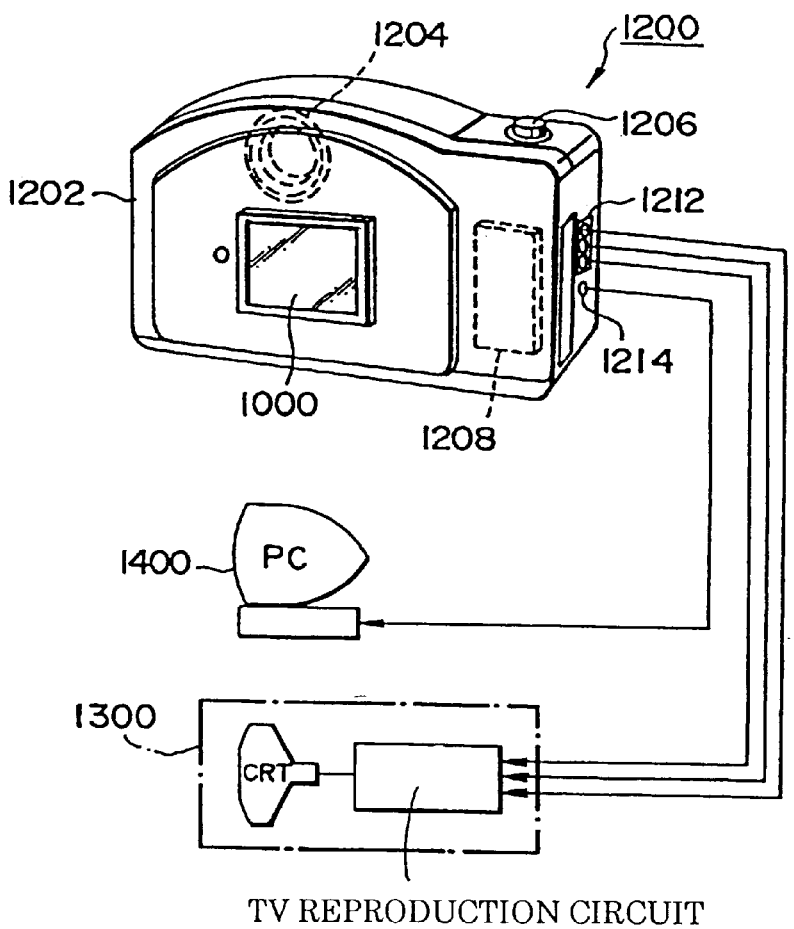
FIG 7 is an external view showing electronic equipment (a digital still camera) which incorporates the liquid-crystal display device of the present invention.

Discussed here is a digital still camera in which the liquid-crystal display unit of the present invention is incorporated as a finder. FIG. 7 is a perspective view showing the construction of the digital still camera, and also simply showing a connection with external devices.

Ordinary cameras expose a film to the image of a subject, while a digital still camera 1200 produces a video signal by photoelectrically converting the image of a subject through an image pickup device such as a CCD (Charge Coupled-Device). The digital still camera 1200 includes a liquid crystal panel of the above-referenced liquid-crystal display unit 1000, behind a case 1202 (in front of the case 1202 in FIG. 7), and presents a display in accordance with the video signal from the CCD. The liquid-crystal display unit 1000 functions as a finder for presenting the image of the subject. A light receiving unit 1204, including an optical lens and the CCD, is arranged on the front of the case 1202 (on the back of the case 1202 in FIG. 7).

When a photographer presses a shutter button 1206 recognizing the subject image presented on the liquid-crystal display unit 1000, the video signal on the CCD at the moment is transferred to and stored in a memory in a circuit board 1208. In the digital still camera 1200, video signal output terminals 1212 and an input/output terminal 1214 for data communication are provided on one side surface of the case 1202. As shown in FIG. 7, as necessary, a television monitor 1300 is connected to the video signal output terminals 1212, and a personal computer 1400 is connected to the input/output terminal 1214 for data communication. In response to predetermined operations, the video signal stored in the memory in the circuit board 1208 is output to the television monitor 1300 or the personal computer 1400.

(2) Portable Telephone and Other Electronic Equipment

Figure 8:
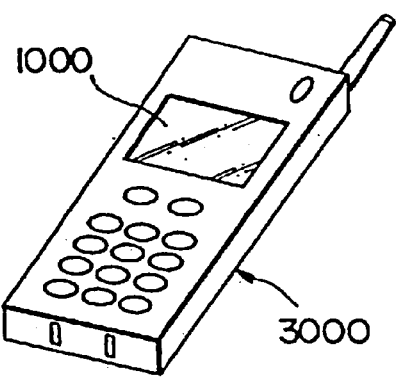
Figure 8:
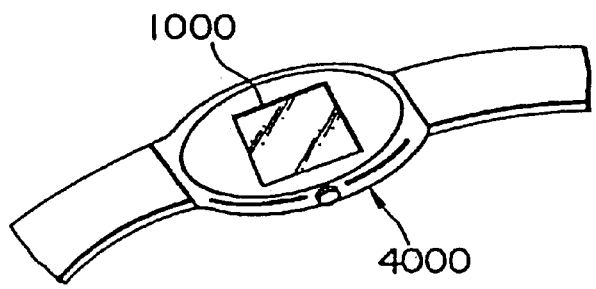
Figure 8:
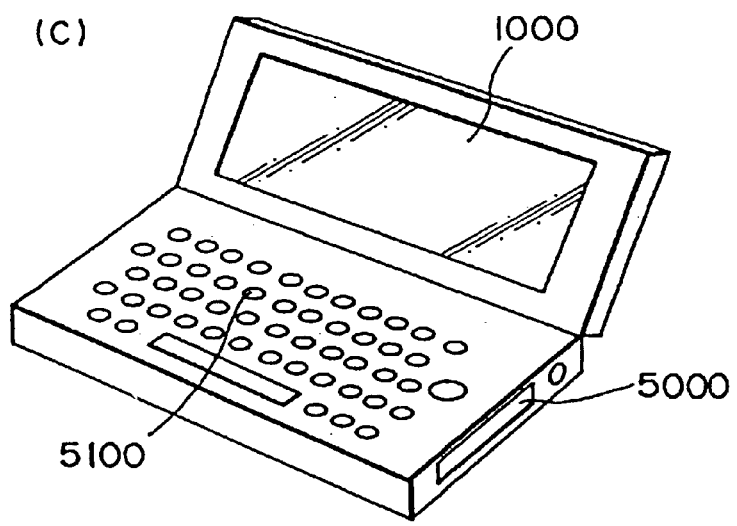

FIGS. 8(A), 8(B) and 8(C) are external views of electronic equipment which incorporates a liquid-crystal display unit as the electrooptical device of the present invention. FIG. 8(A) shows a portable telephone 3000, which includes the liquid-crystal display unit 1000 on the upper front surface thereof. FIG. 8(B) shows a wristwatch 4000, which includes the liquid-crystal display unit 1000 on the center front thereof. FIG. 8(C) shows portable information equipment 5000, which includes the liquid-crystal display unit 1000 as a display and an input unit 5100.

Besides the liquid-crystal display unit 1000, these pieces of electronic equipment include a variety of circuits, such as a display information output source, a display information processing circuit, a clock generator circuit, and a display signal generator unit including a power source circuit for supplying these circuits with power. The display presents a video image in the portable information equipment 5000, when it is supplied with the video signal generated by the display signal generator in response to information from the input unit 5100.

Electronic equipment which incorporates the liquid-crystal display unit 1000 of the present invention is not limited to the digital still camera, the portable telephone, the wirstwatch, and portable information equipment, and may be any of a diversity of electronic equipment, such as electronic pocketbook, pager, POS terminal, IC card, mini disc player, liquid-crystal projector, multi-media personal computer (PC), engineering workstation (EWS), notebook type personal computer, word processor, television, viewfinder type or direct-monitor viewing type video tape recorder, electronic tabletop calculator, car navigation system, apparatus having a touch panel, and clock.

From the standpoint of driving method, the liquid-crystal display panel employed may be a passive matrix display panel or a static driving liquid-crystal display panel with no switching device incorporated therewithin, or an active matrix addressing liquid-crystal display panel with a three-terminal switching device, represented by a TFT (thin-film transistor) or a two-terminal switching device represented by a TFD (thin-film diode) incorporated therewithin, and from the standpoint of electrooptical characteristics, a diversity of liquid-crystal display panels may be employed including the one of a TN type, STN type, a guest-host type, a phase-change type, or a ferroelectric type.

The devices of the present invention have been discussed in connection with several specific embodiments, and changes may be made in the present invention without departing from the scope of the present invention. The above-referenced embodiments employ the liquid-crystal display device as video display means of the electrooptical device (an electrooptical display unit), but the present invention is not limited to this display, and the present invention may be applied to a variety of electrooptical means, such as a flat CRT, a compact television set employing a liquid-crystal shutter, electroluminescence, plasma display, CRT display, or FED (Field Emission Display).

What is claimed is:

1. A wiring board comprising:
   a first single-sided board having a first base body, said first base body having an insulative property and a first wiring layer formed in a predetermined pattern on the first base body;
   a second single-sided board having a second base body, said second base body having an insulative property and a second wiring layer formed in a predetermined pattern on the second base body;
   an insulating layer located to cover the first and second wiring layers, said insulating layer being formed on at least one of the first and second single-sided boards;
   a hole forming a contact section, said contact section created in the insulating layer by removal of a portion of the insulating layer, to permit electrical connection within a predetermined area between the first wiring layer and the second wiring layer; and
   the first wiring layer being arranged adjacent to the second wiring layer, the first single sided board being bonded to the second single-sided board through an anisotropically conductive adhesive layer, said layer providing electrical connection between the first wiring layer and the second wiring layer in the contact section.

2. The wiring board according to claim 1, wherein the second single-sided board is arranged to overlap a portion of the first single-sided board.

3. The wiring board according to claim 1, wherein the first single-sided board has a shape defining an exterior configuration matching a general exterior configuration of the wiring board.

4. The wiring board according to claim 1, wherein a portion of the second single-sided board is bonded onto the first single-sided board while a remaining portion thereof remains unbonded to the first single-sided board.

5. The wiring board according to claim 1, wherein the first single-sided board comprises an input terminal region and an output terminal region.

6. The wiring board according to claim 4, wherein the first single-sided board comprises an input terminal region and a first output terminal region, and the second single-sided board comprises a second output terminal region.

7. The wiring board according the claim 1, wherein the contact section comprises a bump within the hole.

8. The wiring board according to claim 1, wherein the insulating layer is comprised of at least one of the first single-sided board and the second single-sided board.

9. The wiring board according to claim 1, wherein the anisotropically conductive adhesive layer is formed by thermo compression bonding the first single-sided board and the second single-sided board with an anisotropically conductive film interposed therebetween, said anisotropic conductive film providing a plurality of dispersed electrically conductive particles electrically connecting the adjacent first and second wiring layers.

10. An electrooptical device comprising:
    an electrooptical panel forming a central layer located between a first outer layer substrate and a mutually opposed second outer layer substrate;
    the first substrate having a first wiring bonding region which does not overlap the second substrate;
    the second substrate having a second wiring bonding region which does not overlap the first substrate; and
    at least one of the first wiring bonding region and the second wiring bonding region being connected to a wiring board, said wiring board having a first single-sided board having a first base body, said first base body having an insulative property and a first wiring layer formed in a predetermined pattern on the first base body, and a second single-sided board having a second base body, said second base body having an insulative property and a second wiring layer formed in a predetermined pattern on the second base body.

11. The electrooptical device according to claim 10, wherein the electrooptical panel layer is a liquid-crystal layer.

12. The electrooptical device according to claim 11, comprising electronic equipment incorporating the liquid-crystal layer, said electronic equipment selected from the group consisting of: digital camera, portable telephone, wristwatch, portable information equipment, electronic pocketbook, pager, POS terminal, IC card, mini disc player, liquid-crystal projector, multi-media personal computer, engineering workstation, notebook type personal computer, word processor, television, viewfinder type video tape recorder, direct-monitor viewing video tape recorder, electronic tabletop calculator, car navigation system, apparatus having a touch panel, and clock.

13. The electrooptical device of claim 10 comprising:
an insulating layer located to cover the first and second wiring layers being formed on at least one of the first and second single-sided boards;
a hole forming a contact section, said contact section being devoid of said insulating material and created within a predetermined area in the insulating layer to permit electrical connection between the first wiring layer and the second wiring layer; and
the first wiring layer being arranged adjacent to the second wiring layer, the first single sided board being bonded to the second single-sided board through an anisotropically conductive adhesive layer, said anisotropically conductive adhesive layer providing dispersed electrically conductive particles, said particles providing electrical connection between the first wiring layer and the second wiring layer via the contact section.

14. The wiring board according to claim 1, wherein a plurality of holes each form one of a plurality of contact sections, said plurality of contact sections being each created within a predetermined area in the insulating layer to permit electrical connection between the first wiring layer and the second wiring layer.

15. A wiring board comprising:
a first single-sided board having a first base body, said first base body having an insulative property, and a first wiring layer formed in a predetermined pattern on the first base body;
a second single-sided board having a second base body, said second base body having an insulative property, and a second wiring layer formed in a predetermined pattern on the second base body;
an insulating layer located to cover the first and second wiring layers, said insulating layer being formed on at least one of the first and second single-sided boards;
a hole forming a contact section, said contact section created by removal of at least a portion of the insulating layer to permit electrical connection between the first wiring layer and the second wiring layer;
the first and second single-sided boards being arranged to align the first wiring layer and the second wiring layer at the contact section, the first single sided board being bonded to the second single-sided board through an anisotropically conductive adhesive layer;
said anisotropically conductive adhesive layer providing dispersed electrically conductive particles, said particles providing electrical connection between the first wiring layer and the second wiring layer at the contact section; and
the first wiring layer of the first single-sided board extends beyond a perimeter of the second wiring layer of the second single-sided board, the extension forming a free end of the first single-sided board.

16. The wiring board according to claim 15, wherein a plurality of holes each form one of a plurality of contact sections, said plurality of contact sections being each created within a predetermined area in the insulating layer to permit electrical connection between the first wiring layer and the second wiring layer.

17. A wiring board comprising:
a first board including a plurality of first wirings, the plurality of first wirings being divided into at least two groups;
a second board including a second wiring formed thereon, and arranged such that the second wiring faces the first wirings,
wherein the second wiring connects one of the first wirings in one of the two groups and another of the first wirings in the other of the two groups;
an insulating layer positioned between the first and second board and insulating a second wiring from other first wirings crossing thereto; and
a hole forming at least one contact section; created in the insulating layer, at which the first and second wirings are connected to one another.

18. The wiring board according to claim 17, wherein the second board overlaps a portion of the first board.

19. The wiring board according to claim 17, wherein a portion of the second board is bonded onto the first board while the remaining portion thereof remains unbonded to the first board.

20. The wiring board according to claim 17, wherein the first board includes an input terminal region and an ouput terminal region.

21. The wiring board according to claim 17, wherein the first board includes an input terminal region and a first ouput terminal region, and the second board includes a second output terminal region.

22. The wiring board according to claim 17, wherein the contact section further comprises a bump within the hole.

23. The wiring board according to claim 17 wherein the insulating layer is comprised of at least one of the first board and the second board.

24. The wiring board according to claim 17 wherein:
the first wiring layer is arranged adjacent to the second wiring layer, the first board is bonded to the second board through an anisotropically conductive adhesive layer, said anisotropically conductive adhesive layer providing dispersed electrically conductive particles, said particles providing electrical connection between the first wiring layer and the second wiring layer via the contact section.

25. The wiring board according to claim 17, wherein a plurality of holes each one of a plurality of contact sections, said plurality of contact sections being each created within a predetermined area in the insulating layer to permit electrical connection between the first wiring layer and the second wiring layer.

26. An electrooptical device comprising:
the wiring board according to claim 17; and
a display panel to which the wiring board is connected.

* * * * *